US008882976B2

(12) United States Patent
Chung et al.

(10) Patent No.: US 8,882,976 B2
(45) Date of Patent: Nov. 11, 2014

(54) MAGNETRON UNIT MOVING APPARATUS FOR PREVENTING MAGNETIZATION AND MAGNETRON SPUTTERING EQUIPMENT HAVING THE SAME

(75) Inventors: Yun-Mo Chung, Yongin (KR); Min-Jae Jeong, Yongin (KR); Jong-Won Hong, Yongin (KR); Eu-Gene Kang, Yongin (KR); Heung-Yeol Na, Yongin (KR); Ki-Yong Lee, Yongin (KR)

(73) Assignee: Samsung Display Co., Ltd., Youngin (KR)

( * ) Notice: Subject to any disclaimer, the term of this patent is extended or adjusted under 35 U.S.C. 154(b) by 734 days.

(21) Appl. No.: 12/481,166

(22) Filed: Jun. 9, 2009

(65) Prior Publication Data
US 2010/0006424 A1 Jan. 14, 2010

(30) Foreign Application Priority Data
Jul. 9, 2008 (KR) .................. 10-2008-0066722

(51) Int. Cl.
C25B 9/00 (2006.01)
C25B 11/00 (2006.01)
C25B 13/00 (2006.01)
C23C 14/00 (2006.01)
H01J 37/34 (2006.01)
C23C 14/35 (2006.01)
C23C 14/54 (2006.01)

(52) U.S. Cl.
CPC ............. *C23C 14/54* (2013.01); *H01J 37/3455* (2013.01); *C23C 14/35* (2013.01); *H01J 37/3408* (2013.01)
USPC .............. 204/298.2; 204/298.16; 204/298.17; 204/298.19; 204/298.21; 204/298.22; 204/298.23; 204/298.27

(58) Field of Classification Search
CPC ..... C23C 14/35; C23C 14/54; H01J 37/3455; H01J 37/3408
USPC ............... 204/298.16, 298.17, 298.19, 298.2, 204/298.21, 298.22, 298.23, 298.27
See application file for complete search history.

(56) References Cited

U.S. PATENT DOCUMENTS 6,351,075 B1 * 2/2002 Barankova et al. ...... 315/111.71
6,864,773 B2 * 3/2005 Perrin .......................... 335/306

(Continued)

FOREIGN PATENT DOCUMENTS

CN 201162043 Y * 12/2008
JP 63125675 A * 5/1988

(Continued)

OTHER PUBLICATIONS

Machine Translation—JP07258842.*

(Continued)

*Primary Examiner* — Michael Band
(74) *Attorney, Agent, or Firm* — H.C. Park & Associates, PLC

(57) ABSTRACT

A magnetron unit moving apparatus for preventing magnetization and magnetron sputtering equipment having the same. The magnetron unit moving apparatus includes a magnetron unit disposed adjacent to a target, to generate a specific magnetic field, and a movement unit to space the magnetron unit and the target apart such that a strength of a magnetic field generated over the target is within a predetermined reference strength range. It is possible to space the target and the magnetron unit apart so as to prevent the target from being magnetized when a process is not performed.

14 Claims, 15 Drawing Sheets

(56) References Cited

U.S. PATENT DOCUMENTS

| | | | | |
|---|---|---|---|---|
| 2001/0009224 A1* | 7/2001 | Han et al. | ................ | 204/298.2 |
| 2009/0194409 A1* | 8/2009 | Utsunomiya et al. | .... | 204/192.12 |
| 2009/0236221 A1* | 9/2009 | Zhang et al. | ............. | 204/298.12 |

FOREIGN PATENT DOCUMENTS

| | | | |
|---|---|---|---|
| JP | 05148642 A * | 6/1993 | |
| JP | 7-54142 | 2/1995 | |
| JP | 07258842 A * | 10/1995 | |
| JP | 11217669 A * | 8/1999 | |
| JP | 11-335830 | 12/1999 | |
| JP | 2000309867 A * | 11/2000 | |
| JP | 2006-002244 | 1/2006 | |
| JP | 2007-204811 | 8/2007 | |
| KR | 2005018716 A * | 2/2005 | |
| KR | 2006-76633 | 7/2006 | |
| KR | 10-2008-0045592 | 5/2008 | |

OTHER PUBLICATIONS

Machine Translation—JP2000309867.*
Machine Translation JP07054142.*
Korean Registered Patent of KR 2005018716 A—Reg. No. 10-0529915.*

* cited by examiner

MAGNETRON UNIT MOVING APPARATUS FOR PREVENTING MAGNETIZATION AND MAGNETRON SPUTTERING EQUIPMENT HAVING THE SAME

CROSS-REFERENCE TO RELATED APPLICATION

This application claims the benefit of Korean Patent Application No. 10-2008-0066722, filed in the Korean Intellectual Property Office on Jul. 9, 2008, the disclosure of which is hereby incorporated herein by reference in its entirety.

BACKGROUND OF THE INVENTION

1. Field of the Invention

Aspects of the present invention relate to magnetron sputtering equipment, and more particularly, to a magnetron unit moving apparatus capable of spacing a target and a magnetron apart so as to prevent magnetization, and a magnetron sputtering equipment having the magnetron unit moving apparatus.

2. Description of the Related Art

As shown in FIG. 1, a magnetron sputtering apparatus generally includes a vacuum chamber 10, a supply pipe 11 of an inert gas (such as argon) connected to the vacuum chamber 10, a vacuum pump (not shown) connected to the vacuum chamber 10 through an exhaust pipe 12, a chuck 20 and a target 30 disposed to face each other in the vacuum chamber 10, and a high-frequency power supply 14 to apply a high frequency to the chuck 20. The high-frequency power supply 14 is connected with the chuck 20 through an electrode 13.

A magnetron unit 40 that can provide a magnetic field required for a process to the target 30 is installed in the vacuum chamber 10. The magnetron unit 40 includes a magnet 42 and a fixing plate 41 that fixes the magnet 42, and is disposed above the target 30. The target 30 and the magnet 42 are spaced apart by a predetermined and fixed distance D when they are installed.

In the magnetron sputtering apparatus, a substrate 21 is placed on the chuck 20. Argon is supplied into the vacuum chamber 10 through the supply pipe 11. The vacuum pump is operated to exhaust the gas in the vacuum chamber 10, such that a vacuum degree required for a process is achieved in the vacuum chamber 10. Subsequently, a high frequency is applied to the chuck 20 from the high-frequency power supply 14, and thus plasma is generated between the substrate 21 and the target 30. Direct current (DC), alternating current (AC), a radio frequency (RF), pulsed DC, a mid-frequency, a very high frequency (VHF), etc., can be applied to the chuck 20.

The plasma activates the argon, and the activated argon collides against the target 30, to which a ground voltage or a negative voltage is applied, and sputters the target 30. The particles of a target material sputtered due to a specific magnetic field generated from the target 30 move to the surface of the substrate 21. The sputtered particles of the target material accumulate on the surface of the substrate 21, such that a layer of the target material is formed on the substrate.

Conventionally, the above-described sputtering method is frequently used to crystallize polysilicon using a metal catalyst. The sputtering method is suitable for forming a layer on a large area of the substrate 21, and facilitates control of the amount of deposited metal, such as nickel, according to process control. According to super grain silicon (SGS) crystallization, however, a small amount of metal equal to or less than a specific amount must be deposited, unlike metal induced crystallization (MIC) or metal induced lateral crystallization (MILC). Thus, SGS crystallization has a problem in deposition uniformity and deposition rate control.

The conventional magnetron sputtering equipment has the magnetron unit 40 that generates the specific magnetic field above the target 30. In addition, the magnetron unit 40 and the target 30 are spaced apart by the specific distance D. For example, when a sputtering process is performed, the magnetron unit 40 controls the deposition uniformity and deposition rate of the target particles on the substrate 21 while generating a magnetic field of 200 to 800 gauss toward the target 30.

However, the conventional magnetron unit 40 is kept apart from the target 30 by the distance D even after the sputtering process is finished, and thus the target 30 formed of a magnetic material or a magnetizable material is magnetized. When the target 30 is magnetized to a specific gauss or more as mentioned above, the magnetic field generated over the target 30 during the process may be distorted. As a result, the deposition uniformity of the target particles deteriorates due to the magnetization of the target 30, thus resulting in quality deterioration of a product.

SUMMARY OF THE INVENTION

Aspects of the present invention provide a magnetron unit moving apparatus to prevent magnetization, which spaces a target formed of magnetic material, such as nickel, and a magnetron unit apart by a specific distance to prevent the target from being magnetized when a sputtering process is not performed, and magnetron sputtering equipment having the magnetron unit moving apparatus.

Aspects of the present invention also provide a magnetron unit moving apparatus to prevent magnetization, which is capable of uniformly depositing target material on a substrate by preventing a target formed of magnetic material, such as nickel, from being magnetized, and magnetron sputtering equipment having the magnetron unit moving apparatus.

According to an aspect of the present invention, a magnetron unit moving apparatus to prevent magnetization of a target is provided. The apparatus includes: a magnetron unit disposed adjacent to the target, to generate a magnetic field; and a movement unit to space the magnetron unit and the target apart such that a strength of the magnetic field generated over the target is within a predetermined reference strength range.

According to another aspect of the present invention, the movement unit includes: a magnetic field measuring unit disposed adjacent to one side of the target, to measure the strength of the magnetic field generated over the target; a position moving unit connected with the magnetron unit, to move the magnetron unit; and a controller electrically connected with the magnetic field measuring unit, to operate the position moving unit to space the magnetron unit apart from the target such that the measured strength of the magnetic field is within the reference strength range.

According to another aspect of the present invention, the position moving unit is a variable cylinder connected with the magnetron unit and receives an operation signal from the controller to perform an expansion and contraction operation.

According to another aspect of the present invention, the position moving unit is a rotation unit connected with the magnetron unit, to receive an operation signal from the controller to perform a rotation operation, and the rotation unit includes a rotation axis disposed in parallel with the target at both ends of the magnetron unit and having one end rotatably supported at a specific position, and a rotation motor connected to the other end of the rotation axis to rotate the rotation axis.

According to another aspect of the present invention, the position moving unit includes: a first position moving unit; a second position moving unit; and a selector electrically connected with the controller. The first position moving unit is a variable cylinder connected with the magnetron unit to receive an operation signal from the controller to perform an expansion and contraction operation; the second position moving unit is a rotation unit including a rotation axis disposed in parallel with the target at both ends of the magnetron unit and having one end rotatably supported at a specific position, and a rotation motor connected to the other end of the rotation axis to rotate the rotation axis; and the selector transfers an electrical signal to the controller to operate the first position moving unit and/or the second position moving unit.

According to another aspect of the present invention, the magnetron unit moving apparatus further includes an isolation plate installed around the magnetron unit to isolate a first region of a vacuum chamber from a second region of the vacuum chamber and to absorb a specific magnetic field. The magnetron unit is positioned between the first region, in which the target is disposed, and the second region.

According to another aspect of the present invention, the magnetic field measuring unit measures a strength of a magnetic field generated over one surface of the target opposite to the surface of the target facing the magnetron unit.

According to another aspect of the present invention, the previously set reference magnetic field strength ranges from 0 to 10 gauss.

According to another aspect of the present invention, the magnetron unit includes a fixing plate and a magnet disposed on one surface of the fixing plate.

According to another embodiment of the present invention, a magnetron sputtering equipment is provided, having a magnetron unit moving apparatus to preventing magnetization of a target. The magnetron sputtering equipment includes: a vacuum chamber; a chuck disposed in a lower part of the vacuum chamber to receive a high frequency from outside, and to receive a substrate; a target installed in an upper part of the vacuum chamber to face the chuck; a magnetron unit disposed above the target in the upper part of the vacuum chamber, including a magnet to generate a magnetic field and a fixing plate to fix the magnet; and a movement unit to space the magnetron unit and the target apart such that strength of a magnetic field generated over the target is in a predetermined reference magnetic field strength range.

Additional aspects and/or advantages of the invention will be set forth in part in the description which follows and, in part, will be obvious from the description, or may be learned by practice of the invention.

BRIEF DESCRIPTION OF THE DRAWINGS

These and/or other aspects and advantages of the invention will become apparent and more readily appreciated from the following description of the embodiments, taken in conjunction with the accompanying drawings of which.

DETAILED DESCRIPTION OF THE EMBODIMENTS

Figure 1:
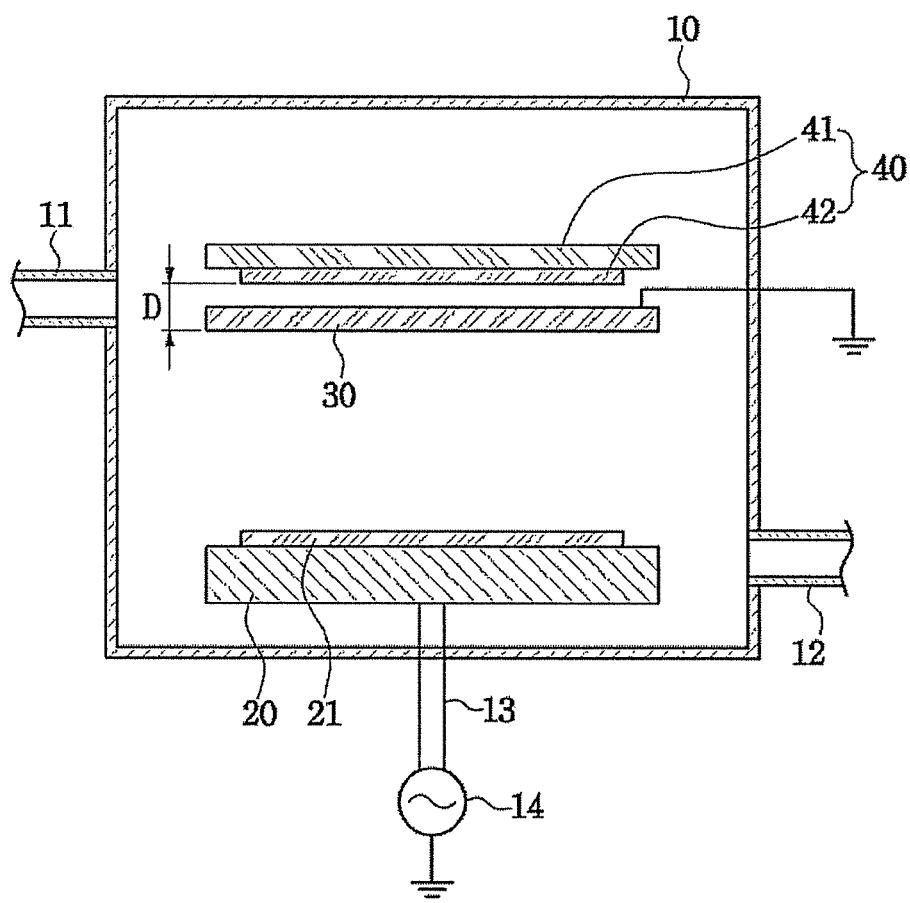
FIG. 1 illustrates conventional magnetron sputtering equipment.

Reference will now be made in detail to the present embodiments of the present invention, examples of which are shown in the accompanying drawings, wherein like reference numerals refer to the like elements throughout. The embodiments are described below in order to explain the present invention by referring to the figures.

First Embodiment

Figure 2:
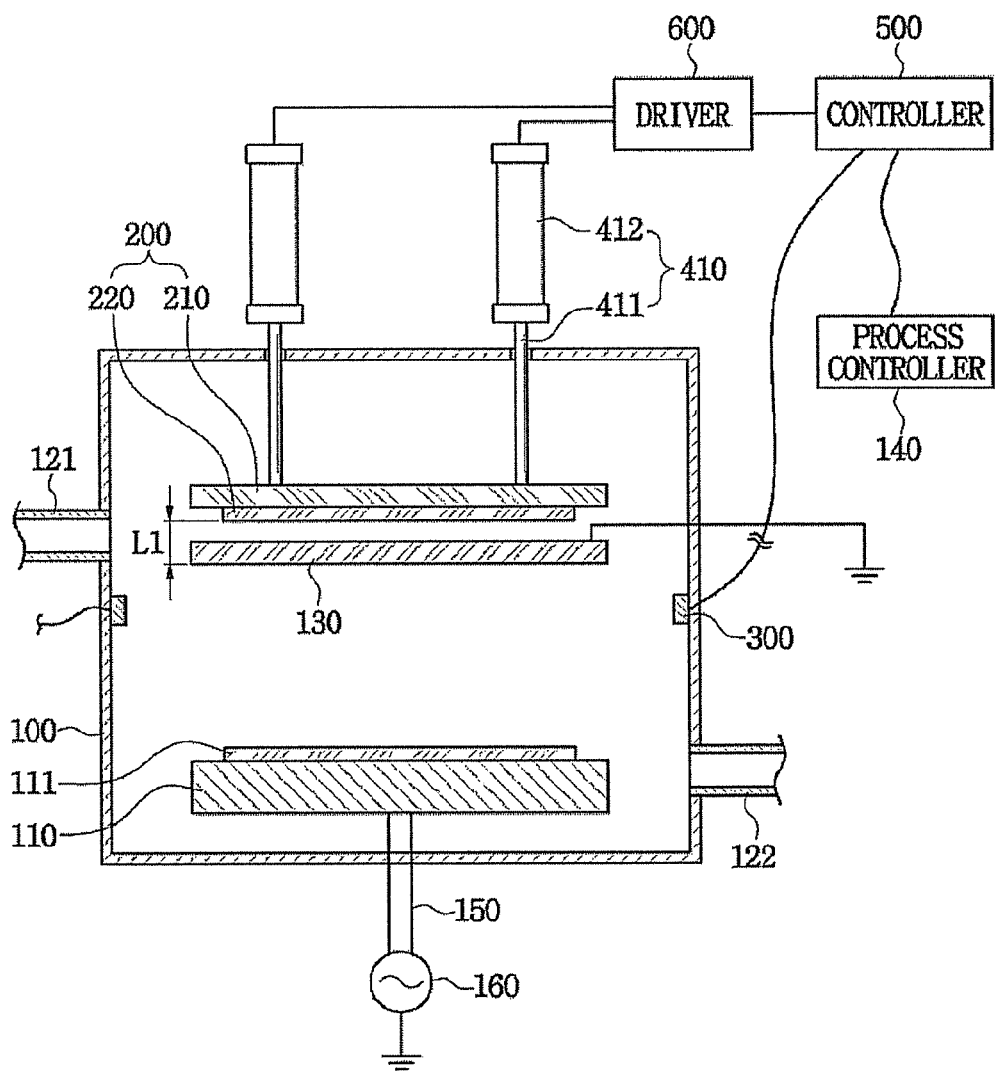
FIG. 2 is a cross-sectional view of magnetron sputtering equipment according to a first embodiment of the present invention.
Figure 3:
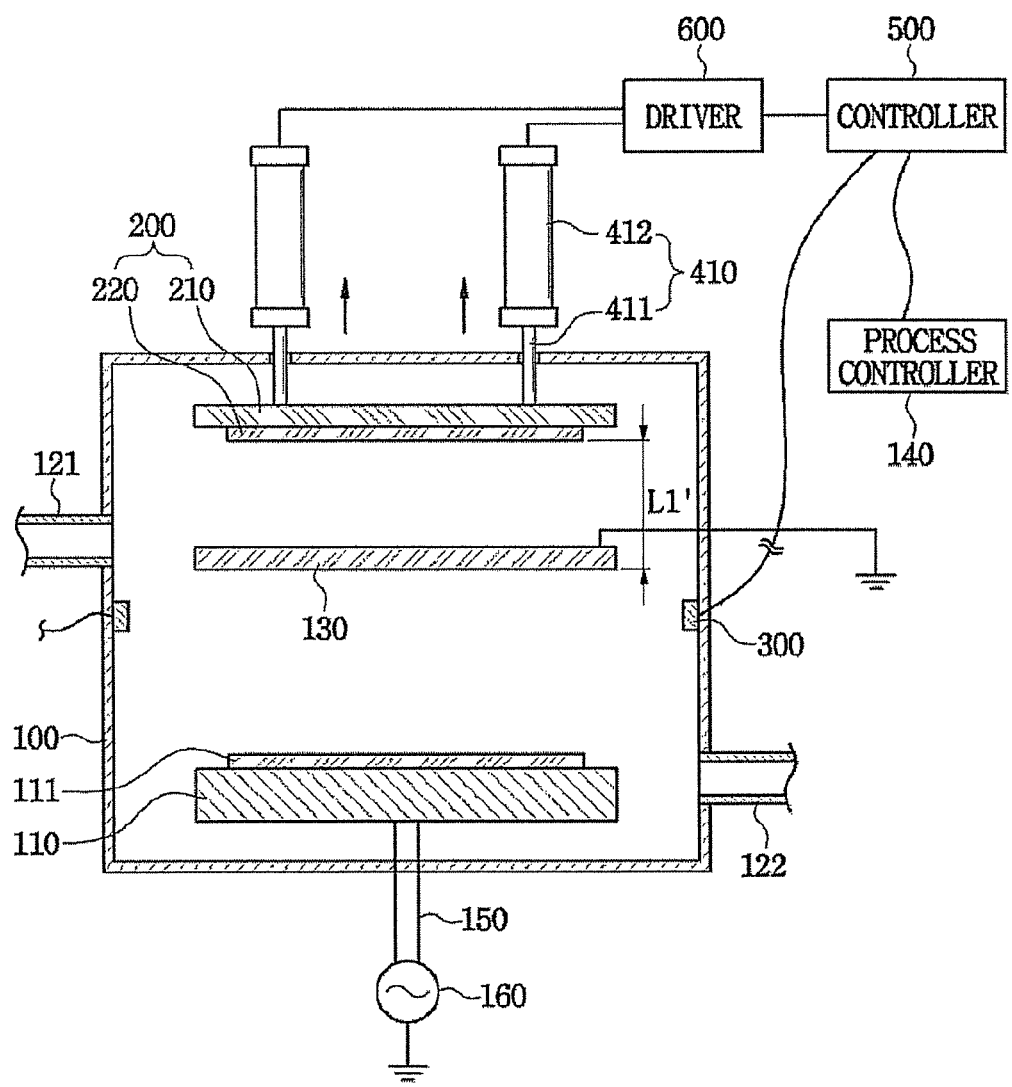
FIG. 3 is a cross-sectional view of the magnetron sputtering equipment of FIG. 2 illustrating operation of a magnetron unit moving apparatus for preventing magnetization.
Figure 4:
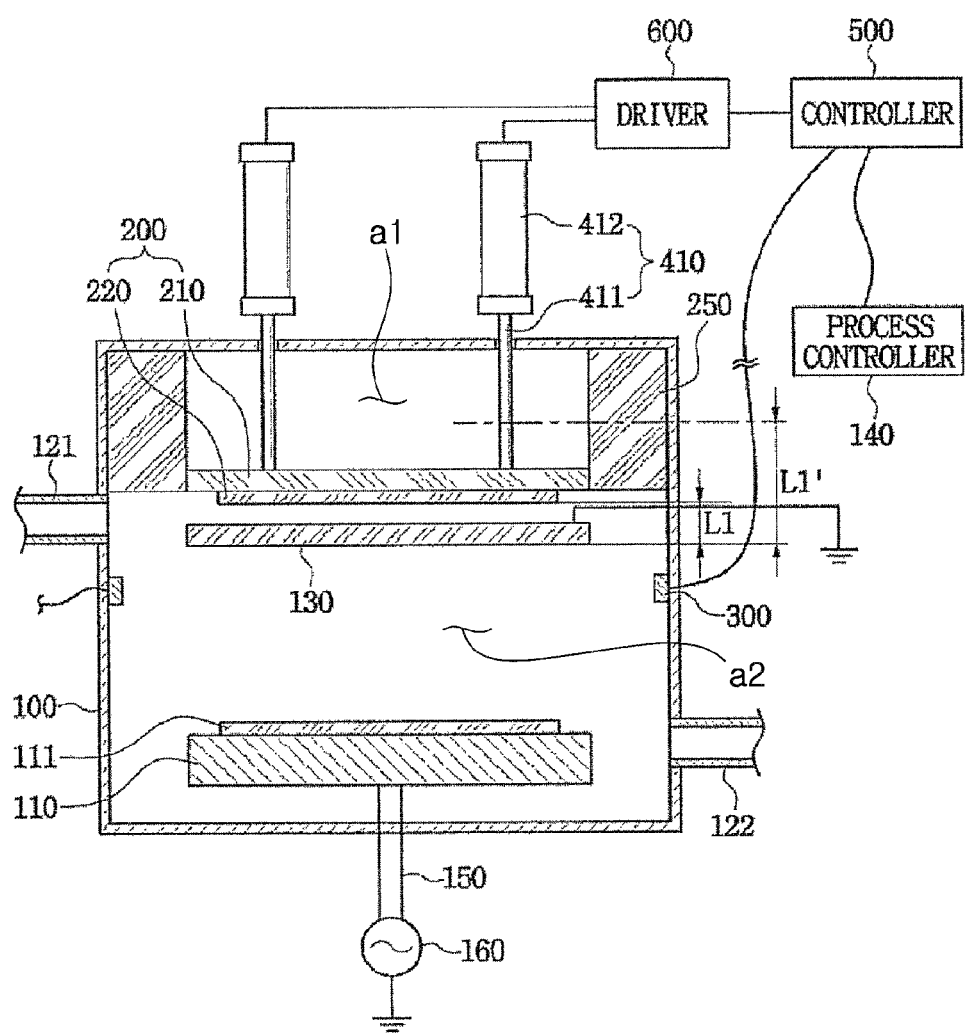
FIG. 4 is a cross-sectional view of the magnetron sputtering equipment of FIG. 2 including an isolation plate installed in a vacuum chamber.
Figure 5:
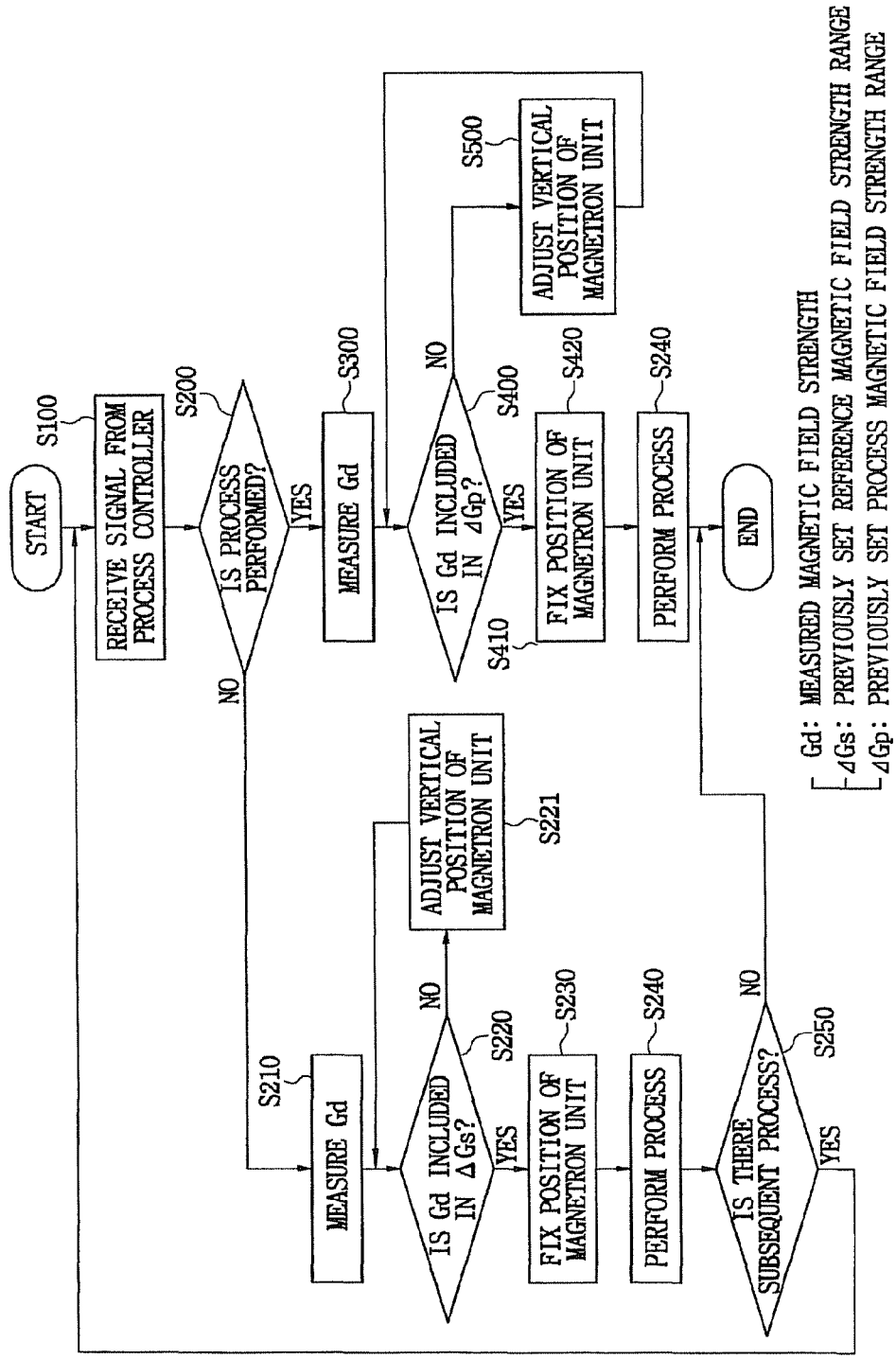
FIG. 5 is a flowchart showing operation of the magnetron unit moving apparatus of FIG. 2.

FIG. 2 is a cross-sectional view of magnetron sputtering equipment according to a first embodiment of the present invention. FIG. 3 is a cross-sectional view of the magnetron sputtering equipment of FIG. 2 showing operation of a magnetron unit moving apparatus to prevent magnetization of a target. FIG. 4 is a cross-sectional view of the magnetron sputtering equipment of FIG. 2 including an isolation plate installed in a vacuum chamber. FIG. 5 is a flowchart showing operation of the magnetron unit moving apparatus FIG. 2.

The magnetron sputtering equipment according to the first embodiment of the present invention includes a vacuum chamber 100 in which a specific vacuum can be created. A gas supply pipe 121, through which inert gas is injected into the vacuum chamber 100, is installed on one side of the vacuum chamber 100. An exhaust pipe 122, through which process gas remaining after a specific process is performed is exhausted, is installed on another side of the vacuum chamber 100.

A chuck 110, on which a substrate 111 having a specific size is placed, is installed in the lower part of the vacuum chamber 100. A target 130 formed of a metal material is installed to face the chuck 110 in the upper part of the vacuum chamber 100. A magnetron unit 200 including a magnet 220 that generates a specific magnetic field and a fixing plate 210 that fixes the magnet 220 is installed above the target 130 in the vacuum chamber 100.

Although not shown in the drawings, the magnetron sputtering equipment according to the first embodiment of the present invention may include a vacuum pump connected to the vacuum chamber 100 through the exhaust pipe 122, and a high-frequency power supply to apply a high frequency to the chuck 110. The magnetron sputtering equipment also includes a process controller 140 that controls a sputtering process performed in the vacuum chamber 100. The magnetron sputtering equipment also includes a movement unit that spaces the magnetron unit 200 and the target 130 apart such that the strength of a magnetic field generated over the target 130 can be in a previously set (predetermined) reference magnetic field strength range.

The movement unit includes a magnetic field measuring unit 300, a position moving unit, and a controller 500. The magnetic field measuring unit 300 is disposed adjacent to one side of the target 130, and measures a magnetic field generated over the target 130. The position moving unit is connected with the magnetron unit 200, and moves the magnetron unit 200 to a predetermined position. The controller 500 is electrically connected with the magnetic field measuring unit 300, and controls the position moving unit to space the magnetron unit 200 apart from the target 130 such that the measured strength of the magnetic field is in the reference magnetic field strength range. The controller 500 is electrically connected with the process controller 140.

A reference magnetic field strength range ΔGs from 0 to 10 gauss is previously set in the controller 500. A process magnetic field strength range ΔGp from 200 to 800 gauss, in which the sputtering process is performed, may be previously set (predetermined) in the controller 500. The magnetic field measuring unit 300 is installed on the inner wall of the vacuum chamber 100. The magnetic field measuring unit 300 may be installed adjacent to the lower surface of the target 130 as shown in FIG. 2.

The position moving unit is a variable cylinder 410, which is connected with a driver 600 electrically connected with the controller 500 and provided with a driving force from the driver 600 to operate. The variable cylinder 410 includes a variable axis 411 coupled to the upper surface of the fixing plate 210 of the magnetron unit 200 and a cylinder body 412 expanding and contracting the variable axis 411. There may be two or more of the variable cylinders 410.

As shown in FIG. 4, the inside of the vacuum chamber 100 may be partitioned into a first region a1 above the fixing plate 210 and a second region a2, in which the chuck 110 is installed, below the fixing plate 210. An isolation plate 250 may be additionally installed in the vacuum chamber 100 to absorb a magnetic field that may be generated in the first region a1 due to the magnet 220 fixed on the fixing plate 210 while isolating the first region a1 from the second region a2 from each other. The isolation plate 250 may be fixed and installed on the inner wall of the vacuum chamber 100 along both sides of the fixing plate 210.

Operation of the magnetron unit moving apparatus and the magnetron sputtering equipment having the magnetron unit moving apparatus according to the first embodiment of the present invention will be described below with reference to FIGS. 2 to 5. The sputtering process may be performed on the substrate 111 placed on the chuck 110 in the vacuum chamber 100.

The controller 500 receives an electrical signal in real time from the process controller 140 in operation 100. The controller 500 determines whether the sputtering process is performed in the vacuum chamber 100. For example, the process controller 140 may transfer a signal indicating that the process is performed to the controller 500 when the process is performed, and transfer a signal indicating that the process is stopped to the controller 500 when the process is stopped. In operation 200, the controller 500 determines whether the process is performed using the signal indicating that the process is performed or stopped.

If the process is not performed, the controller 500 operates the magnetic field measuring unit 300. The magnetic field measuring unit 300 measures the strength Gd of a magnetic field around the lower surface of the target 130 installed in the vacuum chamber 100 and transfers the measured strength Gd to the controller 500. Subsequently, the controller 500 determines whether the measured magnetic field strength Gd is included in a previously set reference magnetic field strength range ΔGs in operation 220. The reference magnetic field strength range ΔGs may be from 0 to 10 gauss (inclusive).

If the measured magnetic field strength Gd is not in the reference magnetic field strength range ΔGs, the controller 500 transfers an electrical signal to the driver 600. In operation 221, the driver 600 operates the variable cylinder 410, that is, the position moving unit, to increase a distance L1 between the magnet 220 of the magnetron unit 200 and the target 130 shown in FIG. 2 to a distance L1' as shown in FIG. 3. The variable axis 411 of the variable cylinder 410 can pull up the upper surface of the fixing plate 210 of the magnetron unit 200.

The magnetic field measuring unit 300 measures and transfers the strength of a magnetic field over the lower surface of the target 130 to the controller 500 in real time. Therefore, the controller 500 can operate the variable cylinder 410 through the driver 600 to pull up the magnetron unit 200 such that the measured magnetic field strength Gd is within the reference magnetic field strength range ΔGs.

If the measured magnetic field strength Gd is in the reference magnetic field strength range ΔGs, then in operation 230 the controller 500 does not operate the position moving unit and keeps the magnetron unit 200 in position. Subsequently, the controller 500 performs the process using the process controller 140 in operation 240, and determines whether there is a subsequent process in operation 250.

If the process is performed, the controller 500 receives the measured magnetic field strength Gd from the magnetic field measuring unit 300 in operation 300, and determines whether the measured magnetic field strength Gd is in a process magnetic field strength range ΔGp in operation 400.

If the measured magnetic field strength Gd is not in the process magnetic field strength range ΔGp, then in operation 500 the controller 500 pulls up the magnetron unit 200 using the variable cylinder 410 such that the measured magnetic field strength Gd is in the process magnetic field strength range ΔGp from 200 to 800 gauss.

If the measured magnetic field strength Gd is in the process magnetic field strength range ΔGp, then in operation 410 the controller 500 does not operate the position moving unit and keeps the magnetron unit 200 in position. In operation 420, the controller 500 transfers a signal to the process controller 140 to perform the process.

Second Embodiment

Figure 6:
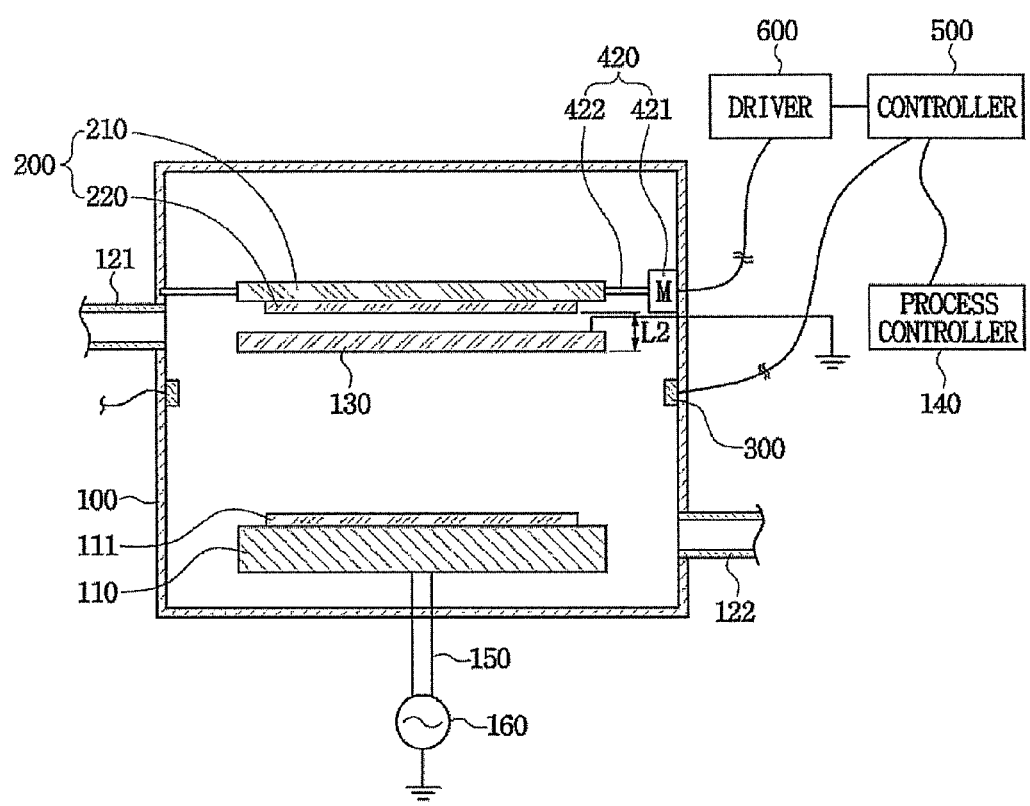
FIG. 6 is a cross-sectional view of magnetron sputtering equipment according to a second embodiment of the present invention.
Figure 7:
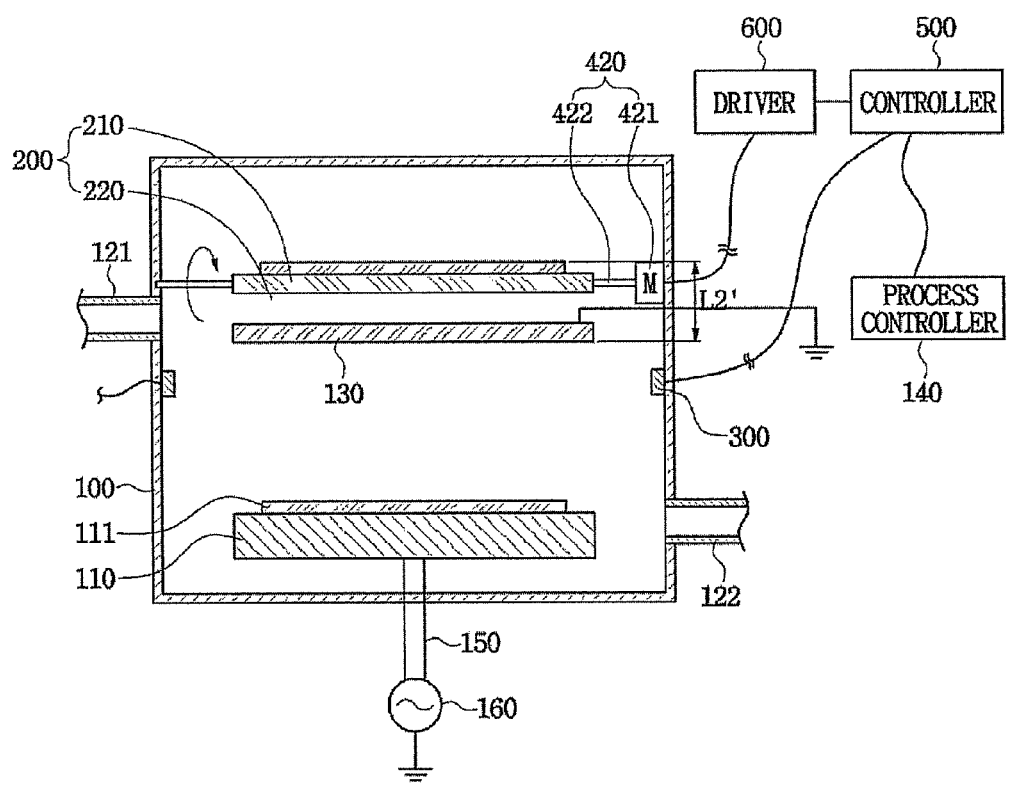
FIG. 7 is a cross-sectional view of the magnetron sputtering equipment of FIG. 6 illustrating operation of a magnetron unit moving apparatus for preventing magnetization.
Figure 8:
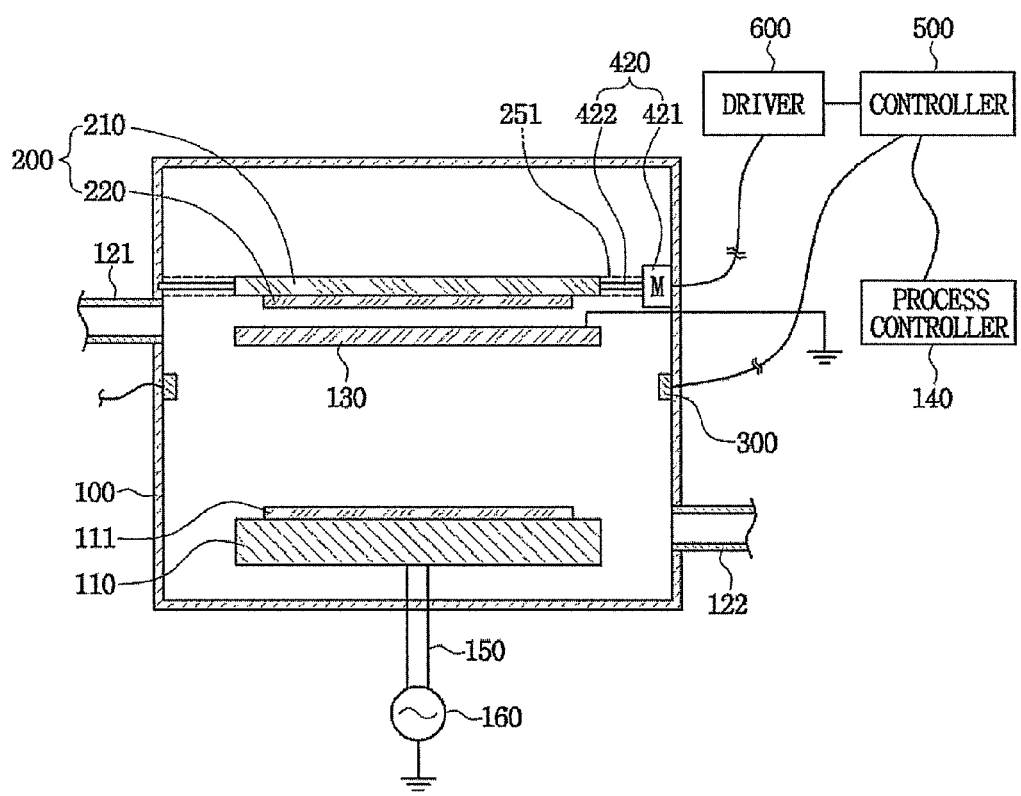
FIG. 8 is a cross-sectional view of the magnetron sputtering equipment of FIG. 6 including an isolation plate installed in a vacuum chamber.
Figure 9:
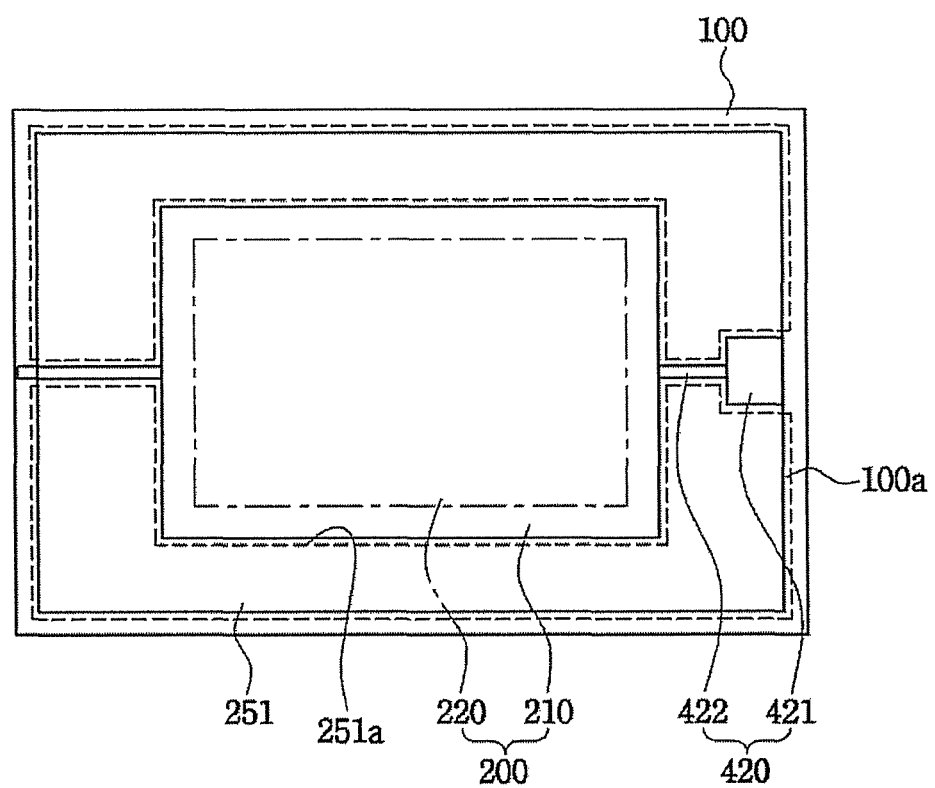
FIG. 9 is a plan view showing the disposition of the isolation plate of FIG. 8.
Figure 10:
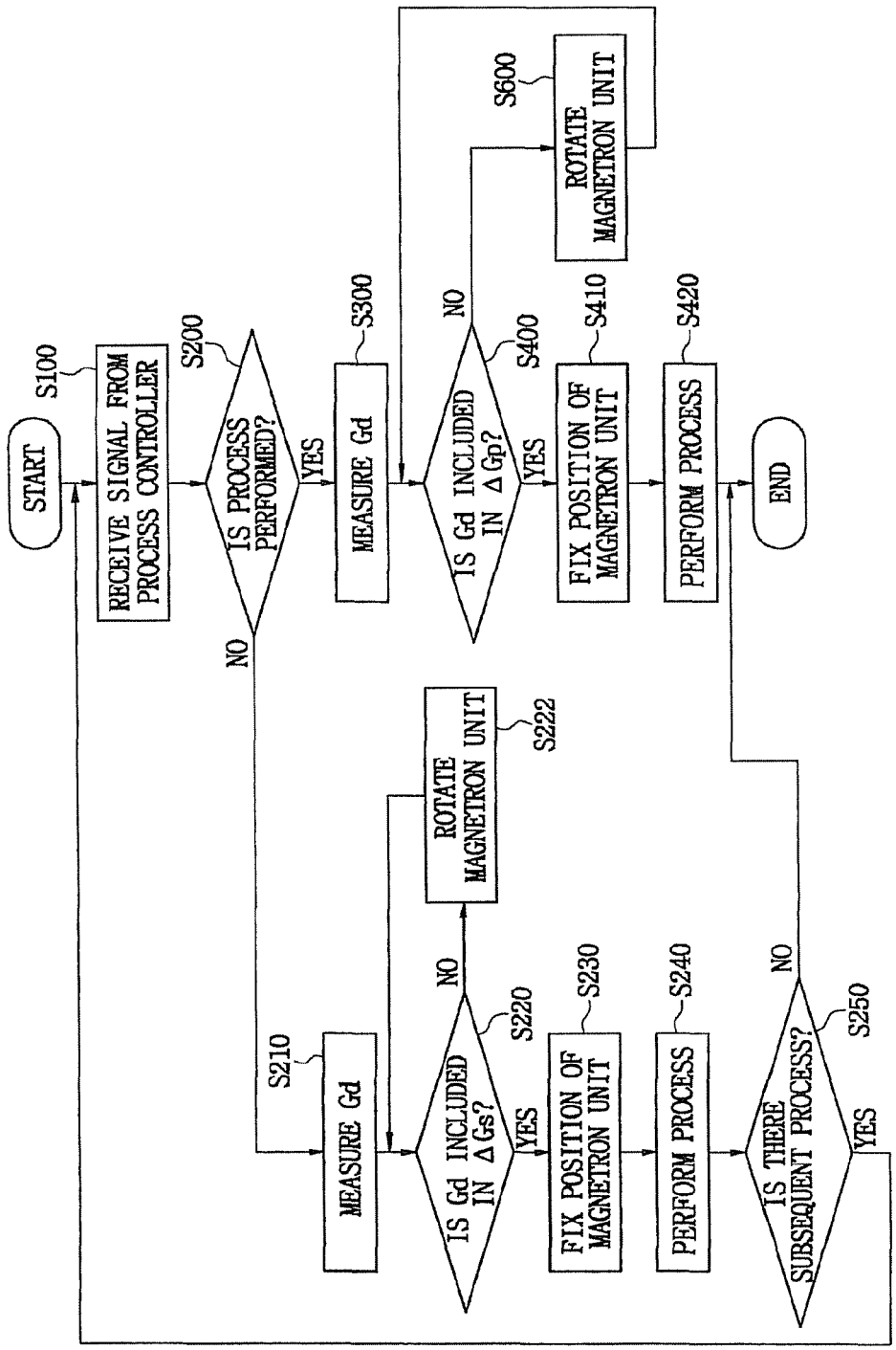
FIG. 10 is a flowchart showing operation of the magnetron unit moving apparatus of FIG. 6.

FIG. 6 is a cross-sectional view of magnetron sputtering equipment according to a second embodiment of the present invention. FIG. 7 is a cross-sectional view of the magnetron sputtering equipment of FIG. 6 showing operation of a magnetron unit moving apparatus for preventing magnetization. FIG. 8 is a cross-sectional view of the magnetron sputtering equipment of FIG. 6 including an isolation plate installed in a vacuum chamber. FIG. 9 is a plan view showing the disposition of the isolation plate of FIG. 8. FIG. 10 is a flowchart showing operation of the magnetron unit moving apparatus of FIG. 6.

The magnetron sputtering equipment according to the second embodiment of the present invention includes the vacuum chamber 100 similar to the vacuum chamber described with respect to the first embodiment. The magnetron sputtering equipment according to the second embodiment includes a position moving unit different from that of the first embodiment.

As shown in FIGS. 6 and 7, the magnetron unit moving apparatus to prevent magnetization according to the second embodiment of the present invention includes a magnetron unit 200 and a movement unit. The magnetron unit 200 may have a similar constitution as that of the first embodiment of the present invention.

The movement unit includes a magnetic field measuring unit 300, the position moving unit and a controller 500. As shown in FIGS. 6 and 7, the position moving unit may be a rotation unit 420 including a rotation motor 421 and a rotation axis 422. The rotation motor 421 is installed on the inner wall of the vacuum chamber 100 to be disposed on one side of the fixing plate 210 of the magnetron unit 200.

The rotation axis 422 protrudes from the both ends of the fixing plate 210. One end of the rotation axis 422 is connected to the inner wall of the vacuum chamber 100 by a hinge, and the other end is connected to the rotation motor 421. The rotation motor 421 may be provided with a driving force from a driver 600 electrically connected with the controller 500, thereby rotating.

As shown in FIGS. 8 and 9, the inside of the vacuum chamber 100 may be partitioned into a first region a1 above the fixing plate 210 and a second region a2, in which a chuck 110 is installed, below the fixing plate 210. An isolation plate 251 may be additionally installed in the vacuum chamber 100 to absorb a magnetic field that is generated in the first region a1 due to the magnet 220 fixed on the fixing plate 210 while isolating the first region a1 from the second region a2.

In the isolation plate 251, an opening 251a is formed along the boundary of the fixing plate 210 and the boundary of the rotation axis 422. The edge of the isolation plate 251 is inserted in a fixing groove 100a formed in the inner wall of the vacuum chamber 100, such that the isolation plate 251 can be fixed. The fixing plate 210 can thus rotate about the rotation axis 422 regardless of the isolation plate 251.

Operation of the magnetron unit moving apparatus for preventing magnetization and magnetron sputtering equipment having the magnetron unit moving apparatus according to the second embodiment of the present invention will be described below with reference to FIGS. 6 to 10. The sputtering process is performed on a substrate 111 placed on the chuck 110 in the vacuum chamber 100.

The controller 500 receives an electrical signal in real time from a process controller 140 in operation 100. The controller 500 determines whether the sputtering process is performed in the vacuum chamber 100 in operation 200. For example, as shown in FIG. 9, the process controller 140 may transfer a signal indicating that the process is performed to the controller 500 when the process is performed, and transfer a signal indicating that the process is stopped to the controller 500 when the process is stopped. Consequently, the controller 500 can determine whether the process is performed.

When receiving the signal indicating that the process is stopped, the controller 500 operates the magnetic field measuring unit 300. The magnetic field measuring unit 300 measures the strength Gd of a magnetic field around the lower surface of a target 130 installed in the vacuum chamber 100 and transfers the measured strength Gd to the controller 500 in operation 210.

In operation 220, the controller 500 determines whether the measured magnetic field strength Gd is in a previously set reference magnetic field strength range ΔGs. The reference magnetic field strength range ΔGs may be from 0 to 10 gauss (inclusive).

If the measured magnetic field strength Gd is not in the reference magnetic field strength range ΔGs, the controller 500 transfers an electrical signal to the driver 600. In operation 222, the driver 600 operates the position moving unit including the rotation motor 421 and the rotation axis 422 to increase a distance L2 between the magnet 220 of the magnetron unit 200 and the target 130 shown in FIG. 6 to a distance L2' as shown in FIG. 7.

The rotation motor 421 may rotate the rotation axis 422 by 180 degrees, thereby rotating the fixing plate 210 of the magnetron unit 200. The magnetic field measuring unit 300 measures and transfers the strength of a magnetic field over the lower surface of the target 130 to the controller 500 in real time. The controller 500 operates the rotation motor 421 through the driver 600 to rotate and dispose the magnet 220 fixed on the fixing plate 210 in the first region a1 such that the measured magnetic field strength Gd is in the reference magnetic field strength range ΔGs.

The first and second regions a1 and a2 are separated from each other by the isolation plate 251. The isolation plate 251 may be formed of a material capable of absorbing a magnetic field. As a result, a magnetic field less of than a specific strength generated over the magnet 220 rotated and disposed in the second region a2 may be prevented from being transferred to the target 130 disposed in the second region a2.

If the measured magnetic field strength Gd is in the reference magnetic field strength range ΔGs, then in operation 230 the controller 500 does not operate the position moving unit and keeps the magnetron unit 200 in position. Subsequently, the controller 500 performs the process using the process controller 140 in operation 240, and determines whether there is a subsequent process in operation 250.

If the process is performed, the controller 500 receives the measured magnetic field strength Gd from the magnetic field measuring unit 300 in operation 300, and determines whether the measured magnetic field strength Gd is in a process magnetic field strength range ΔGp in operation 400.

If the measured magnetic field strength Gd is not within the process magnetic field strength range ΔGp, then in operation 600 the controller 500 rotates the magnetron unit 200 using the rotation motor 421 such that the measured magnetic field strength Gd is in the process magnetic field strength range ΔGp. The process magnetic field strength range ΔGp may range from 200 to 800 gauss.

If the measured magnetic field strength Gd is within the process magnetic field strength range ΔGp, then in operation 410 the controller 500 does not operate the position moving unit and keeps the magnetron unit 200 in position, and transfers a signal to the process controller 140 to perform the process in operation 420.

Third Embodiment

Figure 11:
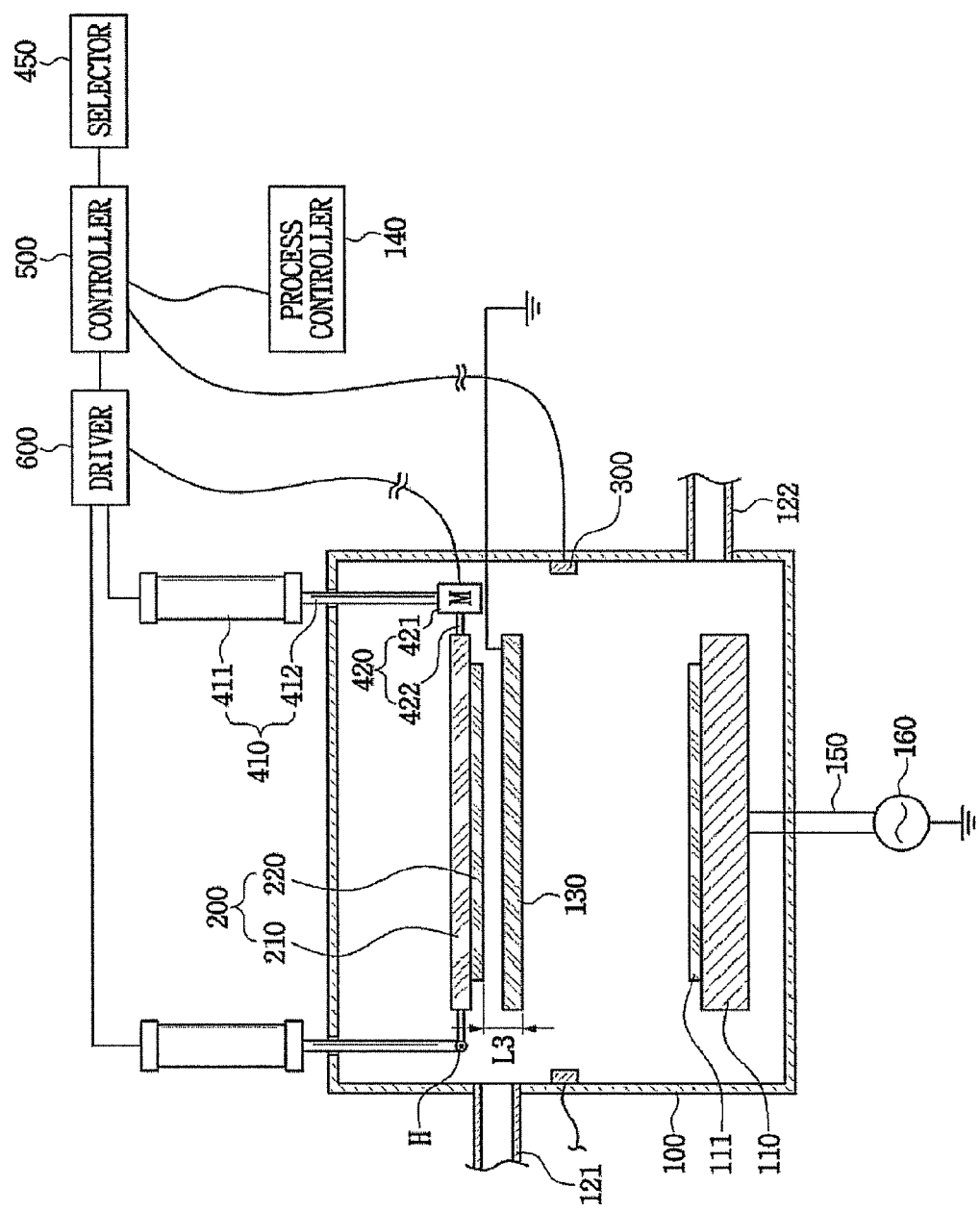
FIG. 11 is a cross-sectional view of magnetron sputtering equipment according to a third embodiment of the present invention.
Figure 12:
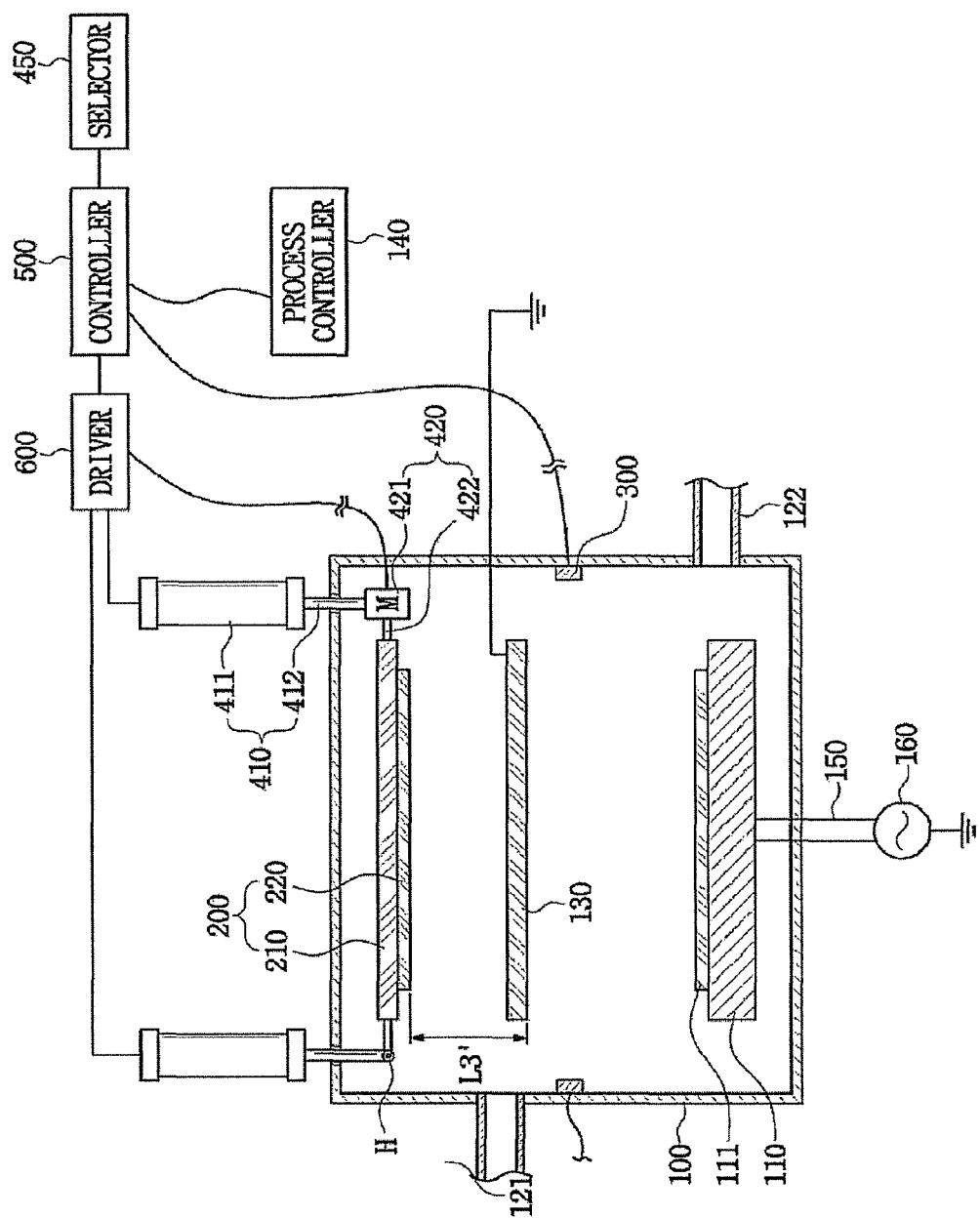
FIG. 12 is a cross-sectional view of the magnetron sputtering equipment of FIG. 11 illustrating operation of a first position moving unit of a magnetron unit moving apparatus.
Figure 13:
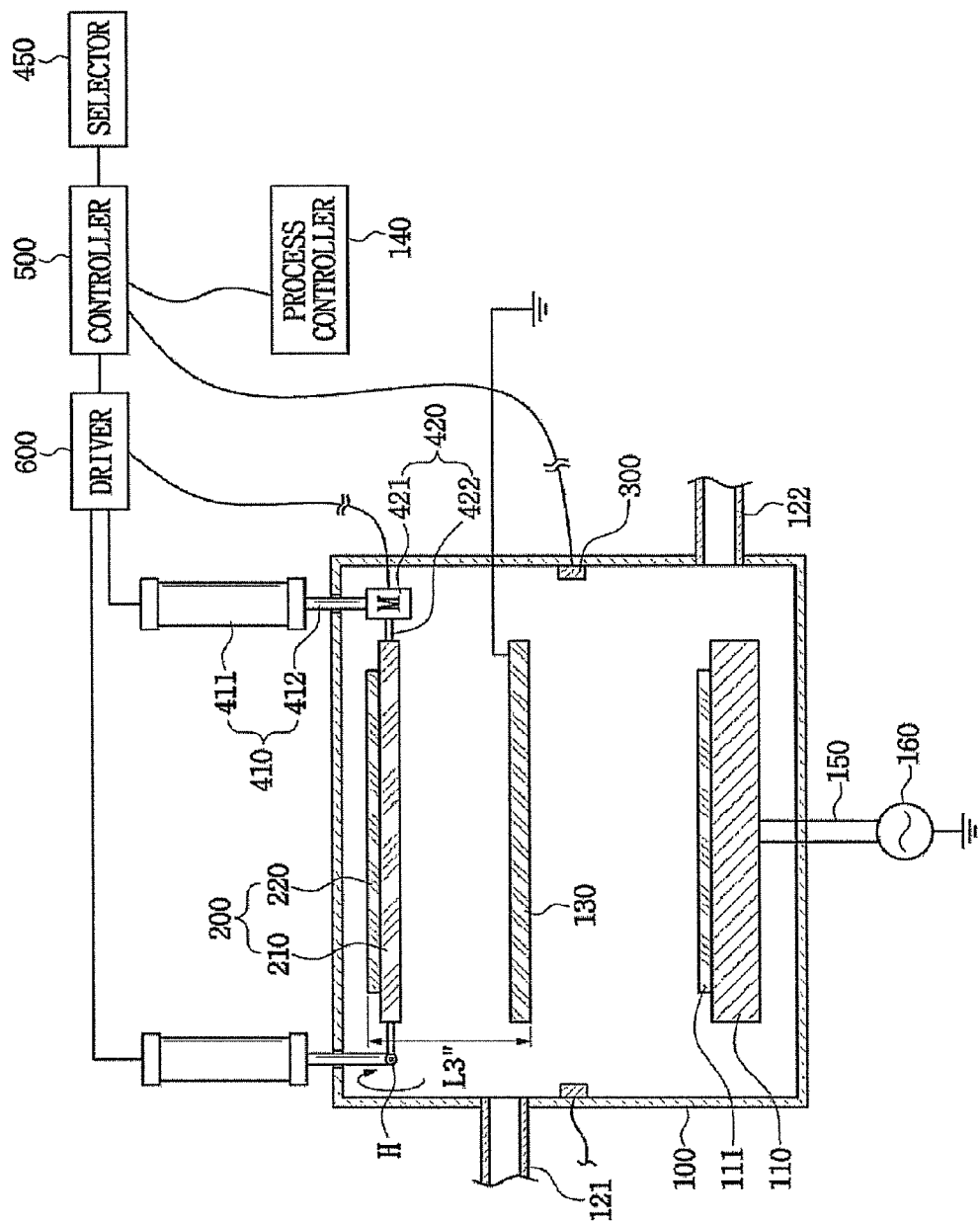
FIG. 13 is a cross-sectional view of the magnetron sputtering equipment of FIG. 11 illustrating operation of a second position moving unit of the magnetron unit moving apparatus of FIG. 12.
Figure 14:
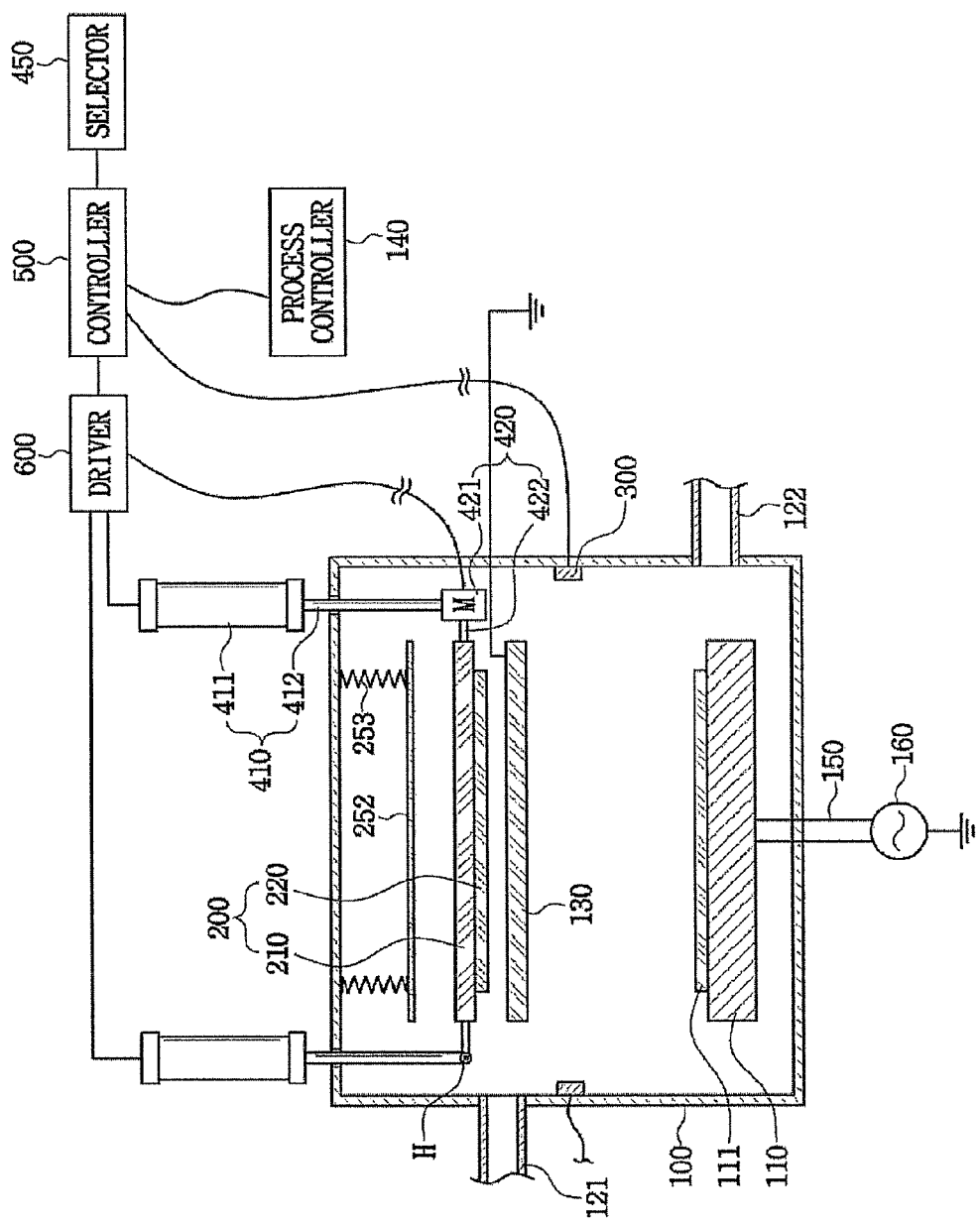
FIG. 14 is a cross-sectional view of the magnetron sputtering equipment of FIG. 11 including an isolation plate installed in a vacuum chamber.
Figure 15:
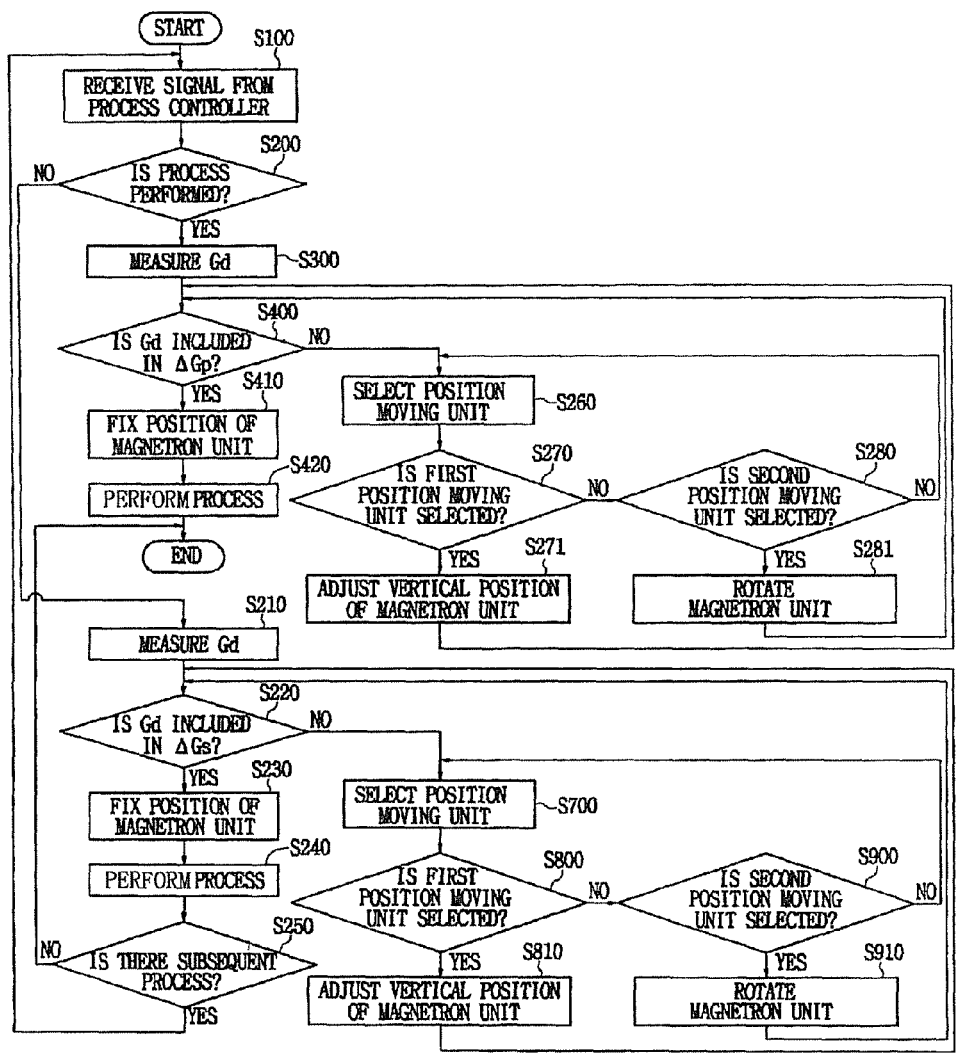
FIG. 15 is a flowchart showing operation of the magnetron unit moving apparatus of FIG. 11.

FIG. 11 is a cross-sectional view of magnetron sputtering equipment according to a third embodiment of the present invention. FIG. 12 is a cross-sectional view of the magnetron sputtering equipment of FIG. 11 showing operation of a first position moving unit of a magnetron unit moving apparatus for preventing magnetization. FIG. 13 is a cross-sectional view of the magnetron sputtering equipment of FIG. 11 showing operation of a second position moving unit of the magnetron unit moving apparatus for preventing magnetization. FIG. 14 is a cross-sectional view of the magnetron sputtering equipment of FIG. 11 including an isolation plate installed in a vacuum chamber. FIG. 15 is a flowchart showing operation of the magnetron unit moving apparatus of FIG. 11.

The magnetron sputtering equipment according to the third embodiment of the present invention includes a position moving unit different from those of the first and second exemplary embodiments. Referring to FIGS. 11 to 13, the magnetron unit moving apparatus according to the third embodiment of the present invention includes a magnetron unit 200 and a movement unit. The magnetron unit 200 may have a similar constitution as those of the first and second embodiments of the present invention.

The movement unit includes a magnetic field measuring unit 300, the position moving unit, a controller 500 and a selector 450. The position moving unit includes a first position moving unit and a second position moving unit. The first position moving unit is a variable cylinder 410 including a variable axis 412 and a cylinder body 411. The second position moving unit is a rotation unit 420 including a rotation motor 421 and a rotation axis 422.

As shown in FIGS. 11 and 12, the rotation axis 422 protrudes from the both ends of the fixing plate 210. The rotation axis 422 protruding from one end of the fixing plate 210 is connected to the rotation motor 421.

Two of the variable cylinders 410 are installed above the fixing plate 210. The end of the variable axis 412 of one of the variable cylinders 410 is connected by a hinge H to the rotation axis 422 protruding from the other end of the fixing plate 210. The end of the variable axis 412 of the other one of the variable cylinders 410 is fixed to the rotation motor 421.

As shown in FIG. 14, the inside of a vacuum chamber 100 may be partitioned into a first region a1 above the fixing plate 210 and a second region a2, in which a chuck 110 is installed, below the fixing plate 210. An isolation plate 252 may be additionally installed in the vacuum chamber 100 to absorb a magnetic field that may be generated in the first region a1 due to the magnet 220 fixed on the fixing plate 210 while isolating the first region a1 from the second region a2. The isolation plate 252 may be disposed above the fixing plate 210. The width of the isolation plate 252 is in a distance between the variable axes 412 of the variable cylinders 410. In addition, the isolation plate 252 can be elastically supported by springs 253 on the upper surface inside the vacuum chamber 100.

Operation of the magnetron unit moving apparatus according to the third embodiment of the present invention will be described below with reference to FIGS. 11 to 15. The sputtering process may be performed on a substrate 111 placed on the chuck 110 in the vacuum chamber 100.

The controller 500 receives an electrical signal in real time from a process controller 140 in operation 100. The controller 500 determines whether the sputtering process is performed in the vacuum chamber 100. For example, as shown in FIG. 15, the process controller 140 transfers a signal indicating that the process is performed to the controller 500 when the process is performed, and a signal indicating that the process is stopped to the controller 500 when the process is stopped.

When receiving the signal indicating that the process is stopped, the controller 500 operates the magnetic field measuring unit 300. The magnetic field measuring unit 300 installed in the vacuum chamber 100 measures the strength Gd of a magnetic field around the lower surface of a target 130 and transfers the measured strength Gd to the controller 500 in operation 210.

Subsequently, the controller 500 determines whether the measured magnetic field strength Gd is in a previously set reference magnetic field strength range ΔGs in operation 220. The reference magnetic field strength range ΔGs may range from 0 to 10 gauss (inclusive).

If the measured magnetic field strength Gd is not in the reference magnetic field strength range ΔGs, the selector 450 selects a position moving unit in operation 700. If the selector 450 selects the first position moving unit in operation 800, then in operation 810 the controller 500 adjusts the vertical position of the magnetron unit 200.

If the measured magnetic field strength Gd is not in the reference magnetic field strength range ΔGs, the controller 500 transfers an electrical signal to a driver 600. The driver 600 operates the variable cylinder 410, which is the first position moving unit, to increase a distance L3 between the magnet 220 of the magnetron unit 200 and the target 130 shown in FIG. 11 to a distance L3' as shown in FIG. 12. The variable axis 412 of the variable cylinder 410 can pull up the upper surface of the fixing plate 210 of the magnetron unit 200.

The magnetic field measuring unit 300 measures and transfers the strength of a magnetic field over the lower surface of the target 130 to the controller 500 in real time. The controller 500 operates the variable cylinder 410 through the driver 600 to pull up the magnetron unit 200 such that the measured magnetic field strength Gd is within the reference magnetic field strength range ΔGs. The isolation plate 252 shown in FIG. 14 may come in contact with the upper surface of the pulled fixed plate 210 and be pulled up.

If the selector 450 selects the second position moving unit in operation 900, then the controller 500 adjusts the position of the rotated magnetron unit 200 in operation 910. The controller 500 transfers an electrical signal to the driver 600. The driver unit 600 operates the second position moving unit, which is the rotation unit 420 including the rotation motor 421 and the rotation axis 422, to increase the distance L3 between the magnet 220 of the magnetron unit 200 and the target 130 shown in FIG. 11 to a distance L3" as shown in FIG. 13.

The rotation motor 421 may rotate the rotation axis 422 by 180 degrees, thereby rotating the fixing plate 210 of the magnetron unit 200. The magnetic field measuring unit 300 measures and transfers the strength of a magnetic field over the lower surface of the target 130 to the controller 500 in real time. The controller 500 operates the rotation motor 421 through the driver 600 to rotate and dispose the magnet 220 fixed on the fixing plate 210 in the first region a1 such that the measured magnetic field strength Gd is within the reference magnetic field strength range ΔGs.

As shown in FIG. 14, the rotated magnet 220 may face the isolation plate 252. The isolation plate 252 may be formed of a material capable of absorbing a magnetic field. Thus, a magnetic field of less than a specific strength generated over the rotated magnet 220 may be absorbed by the isolation plate 252 and not be transferred to the target 130.

If the measured magnetic field strength Gd is in the reference magnetic field strength range ΔGs, then in operation 230 the controller 500 does not operate the position moving unit and keeps the magnetron unit 200 in position. Subsequently, the controller 500 performs the process using the process controller 140 in operation 240, and determines whether there is a subsequent process in operation 250.

When the process is performed, the controller 500 receives the measured magnetic field strength Gd from the magnetic field measuring unit 300 and determines whether the measured magnetic field strength Gd is in a process magnetic field strength range ΔGp in operation 400. If the measured magnetic field strength Gd is not in the process magnetic field strength range ΔGp, the controller 500 may select the first position moving unit in operation 270 or the second position moving unit in operation 280 through the selector 450 as described above.

If the first position moving unit is selected, the variable cylinder 410 adjusts the vertical position of the magnetron unit 200 such that the measured magnetic field strength Gd is in the process magnetic field strength range ΔGp. If the second position moving unit is selected, the rotation unit 420 rotates the magnetron unit 200 such that the measured magnetic field strength Gd is in the process magnetic field strength range ΔGp.

According to aspects of the present invention, a target formed of a magnetic material, such as nickel, and a magnetron unit are spaced apart by a specific distance when a sputtering process is not performed, and thus it is possible to prevent the target from being magnetized. In addition, since the target formed of the magnetic material, such as nickel, is prevented being magnetized, it is possible to uniformly deposit the target material on a substrate.

Although a few embodiments of the present invention have been shown and described, it would be appreciated by those skilled in the art that changes may be made in this embodiment without departing from the principles and spirit of the invention, the scope of which is defined in the claims and their equivalents.

What is claimed is:

1. A magnetron unit moving apparatus to prevent magnetization of a planar target having a length and a width, comprising:
    a magnetron unit installed in a vacuum chamber comprising a first region and a second region and disposed adjacent to the target, the magnetron unit consisting of a magnet to generate a magnetic field and a fixing plate supporting the magnet and configured to rotate around an axis parallel with the length of the target;
    an isolation plate disposed in the vacuum chamber, surrounding the magnetron unit, to isolate the first region from the second region, the isolation plate being configured to absorb the magnetic field; and
    a movement unit comprising a rotation unit configured to rotate the fixing plate between a first position where sputtering occurs, and a second position where sputtering is prevented, such that the magnet is disposed between the fixing plate and the target, when the fixing plate is in the first position, and the fixing plate is disposed between the magnet and the target and a strength of a magnetic field generated over the target is within a reference strength range that prevents magnetization of the target, when the fixing plate is in the second position.

2. The magnetron unit moving apparatus according to claim 1, wherein the movement unit further comprises:
    a magnetic field measuring unit disposed adjacent to one side of the target, to measure the strength of the magnetic field generated over the target;
    a position moving unit connected with the magnetron unit, to move the magnetron unit; and
    a controller electrically connected with the magnetic field measuring unit, to operate the position moving unit to space the magnetron unit apart from the target such that the measured strength of the magnetic field is within the reference strength range.

3. The magnetron unit moving apparatus according to claim 2, wherein the position moving unit is a variable cylinder connected with the magnetron unit and receives an operation signal from the controller to perform an expansion and contraction operation.

4. The magnetron unit moving apparatus according to claim 2, wherein:
    the rotation unit receives an operation signal from the controller to perform the rotation; and
    the rotation unit comprises a rotation axis supporting the fixing plate and having a first end that is rotatably supported at a specific position and an opposing second end, and a rotation motor connected to the second end of the rotation axis to rotate the rotation axis.

5. The magnetron unit moving apparatus according to claim 2, wherein:
    the movement unit further comprises a selector electrically connected with the controller;
    the position moving unit is a variable cylinder connected with the magnetron unit to receive an operation signal from the controller to perform an expansion and contraction operation;
    the rotation unit comprises:
        a rotation axis disposed supporting the fixing plate and having a first end that is rotatably supported at a specific position and an opposing second end; and
        a rotation motor connected to the second end of the rotation axis to rotate the rotation axis; and
    the selector transfers an electrical signal to the controller to operate the position moving unit and/or the rotation unit.

6. The magnetron unit moving apparatus according to claim 4,
    wherein the magnetron unit is positioned between the first region, in which the target is disposed, and the second region.

7. The magnetron unit moving apparatus according to claim 2, wherein the magnetic field measuring unit measures the strength of the magnetic field-over a surface of the target opposite to the surface of the target facing the magnetron unit.

8. The magnetron unit moving apparatus according to claim 1, wherein the reference strength range of the magnetic field ranges from 0 to 10 gauss.

9. A magnetron sputtering equipment having a magnetron unit moving apparatus to prevent magnetization of a planar target having a length and a width, the magnetron sputtering equipment comprising:
    a vacuum chamber comprising a first region and a second region;
    a chuck disposed in a lower part of the vacuum chamber to receive a high frequency from outside and to receive a substrate;
    a target installed in an upper part of the vacuum chamber to face the chuck;
    a magnetron unit installed in a vacuum chamber and disposed above the target, the magnetron unit consisting of a magnet to generate a magnetic field and a fixing plate supporting the magnet and configured to rotate around an axis parallel with the length of the target;
    an isolation plate disposed in the vacuum chamber, surrounding the magnetron unit, to isolate the first region from the second region, the isolation plate being configured to absorb the magnetic field; and
    a movement unit comprising a rotation unit configured to rotate the fixing plate between a first position where sputtering occurs, and a second position where sputtering is prevented, such that the magnet is disposed between the fixing plate and the target, when the fixing plate is in the first position, and the fixing plate is disposed between the magnet and the target and a strength of a magnetic field generated over the target is within a reference magnetic field strength range that prevents magnetization of the target, when the fixing plate is in the second position.

10. The magnetron sputtering equipment according to claim 9, wherein:
the rotation unit receives an operation signal from the controller to perform the rotation; and
the rotation unit comprises a rotation axis supporting the fixing plate and having a first end that is rotatably supported in the vacuum chamber and an opposing second end, and a rotation motor connected to the second end of the rotation axis to rotate the rotation axis.

11. The magnetron sputtering equipment according to claim 10, wherein the magnetron unit is positioned between the first region, in which the target is disposed, and the second region.

12. The magnetron sputtering equipment according to claim 9, wherein the reference magnetic field strength range ranges from 0 to 10 gauss.

13. The magnetron sputtering equipment according to claim 9,
wherein the magnetron unit is positioned between the first region, in which the target is disposed, and the second region.

14. The magnetron unit moving apparatus according to claim 5,
wherein the magnetron unit is positioned between the first region, in which the target is disposed, and the second region.

* * * * *